(12) United States Patent
Cheng et al.

(10) Patent No.: US 6,525,453 B2
(45) Date of Patent: Feb. 25, 2003

(54) FIELD EMITTING DISPLAY

(75) Inventors: Huang Chung Cheng, 2F, No. 14, Alley 2, Lane 86, Chien Kung I Rd., Hsinchu (TW); Fu-Guo Tarntair, Taipei (TW)

(73) Assignee: Huang Chung Cheng, Hsinchu (TW)

( * ) Notice: Subject to any disclaimer, the term of this patent is extended or adjusted under 35 U.S.C. 154(b) by 91 days.

(21) Appl. No.: 09/846,209

(22) Filed: May 2, 2001

(65) Prior Publication Data

US 2002/0163287 A1 Nov. 7, 2002

(51) Int. Cl.[7] .................................................. H01J 1/02

(52) U.S. Cl. ........................ 313/309; 313/495; 313/336; 313/351

(58) Field of Search ................................ 313/309, 336, 313/351, 495; 315/169.4

Primary Examiner—Vip Patel
(74) Attorney, Agent, or Firm—Rosenberg, Klein & Lee

(57) ABSTRACT

The present invention proposes a field emitting display, wherein a field emitting array is formed on a glass substrate. The field emitting array comprises a plurality of arrays of thin film transistors and a plurality of carbon nanotubes used as field emitting cathodes. The magnitude and stability of the field-emitted current of the carbon nanotubes are controlled by using the thin film transistors. The present invention has the characteristics of high quality, large area, and low cost.

8 Claims, 3 Drawing Sheets

FIELD EMITTING DISPLAY

FIELD OF THE INVENTION

The present invention relates to an application of low-temperature poly-silicon thin film transistors (TFTs) and, more particularly, to a field emitting display (FED) uniting TFTs and carbon nanotubes.

BACKGROUND OF THE INVENTION

The maturity of semiconductor technology leads to the progress and development of the realm of vacuum microelectronics, wherein the vacuum microelectronic devices made of silicon are most valued. Various kinds of field emitting arrays have been widely studied. In order to let field emitting arrays be of practical use, the development of field emitting cathodes must tend to low operational voltage and high efficiency. Therefore, the surface work function or the geometrical structure of the field emitting cathode must be as small as possible.

FIG. 1 shows a prior art FED 10, wherein a plurality of raised small cathodes 14 are formed on a silicon substrate 12 by means of semiconductor fabrication technology. The small cathodes 14 correspond to a transparent electrode of indio tin oxide (ITO) so as to let fluorescent bodies 18 glow by means of the electrons emitted from the tips of the raised cathodes 14. However, there is still difficulty of manufacturing large-scaled FED 10 of this kind. Moreover, the raised cathodes 14 are usually made of silicon. Although silicon can be easily processed to form various kinds of emitting tips by means of semiconductor technology so as to shrink the geometrical structure, the work function thereof is too high and the conductivity and stability thereof is low, thereby limiting the application of silicon in FEDs. Therefore, other better materials must be selected for the field emitting electrodes.

Because the carbon nanotube has a caliber smaller than a nanometer, and π electrons suffuse the cylindrical part thereof, it has a good field-emitting characteristic. Therefore, the carbon nanotube is potential to become high-performance material of field emitting electrodes. Additionally, recent researches show that aligned growth of the carbon nanotube is feasible. Therefore, it can be expected that the chance of manufacturing FEDs using the carbon nanotubes will increase greatly.

Many recent literatures report that the carbon nanotube has a good field-emitting characteristic. It is thus not difficult to manufacture field emitting arrays of low operational voltage. However, it is not easy to keep a stable and reliable field-emitted current of the carbon nanotube. The main reason may be that the structure of the carbon nanotube is not rigid enough to resist large currents. Therefore, it is very important to improve the stability and reliability of the field-emitting characteristic of the carbon nanotube. Although various kinds of thermal processing and film coating have been proposed to resolve part of the problem of material stability, many unstable factors, such as variation of the vacuum environment and change of the geometrical structure of the carbon nanotube due to current flow, still exist.

Accordingly, the present invention aims to propose a FED uniting TFTs and tiny carbon nanotubes to resolve the above problems in the prior art.

SUMMARY OF THE INVENTION

The primary object of the present invention is to provide a FED using TFTs to improve the stability of field-emitted currents. The present invention unites TFTs and carbon nanotubes so as to not only improve the stability of field-emitted currents but also control the field emitting cathodes by means of the mature driving circuit of the TFT liquid crystal display (LCD).

Another object of the present invention is to manufacture a FED using the low-temperature poly-silicon (LTPS) technique so that TFTs and the complex driving circuit thereof can be fabricated on a glass substrate. Thereby, the effects of high quality, large area, and low cost can be achieved.

According to the present invention, a field emitting array comprises a plurality of arrays of poly-silicon TFrs. A poly-silicon layer is formed on a glass substrate to be used as sources and drains. Next, an insulating layer is formed thereon, and a gate is then grown on the insulating layer. A plurality of carbon nanotubes corresponding to a transparent electrode of ITO and a fluorescent layer are grown on each of the drains. The carbon nanotubes will operate at a low voltage under the control of the TFTs so as to emit electrons to let the fluorescent layer glow.

The various objects and advantages of the present invention will be more readily understood from the following detailed description when read in conjunction with the appended drawings, in which:

DETAILED DESCRIPTION OF THE PREFERRED EMBODIMENTS

Because the carbon nanotubes have very high field-emitted currents and very low threshold voltages, they are very potential in the applications of vacuum electronics, especially the FEDs. The present invention is characterized in that TFTs are exploited to control the field-emitted current of the carbon nanotube so that the field-emitting characteristic of the carbon nanotube will be stable, thereby simplifying the fabrication process of the field emitting gates and greatly reducing the cost.

Figure 1:
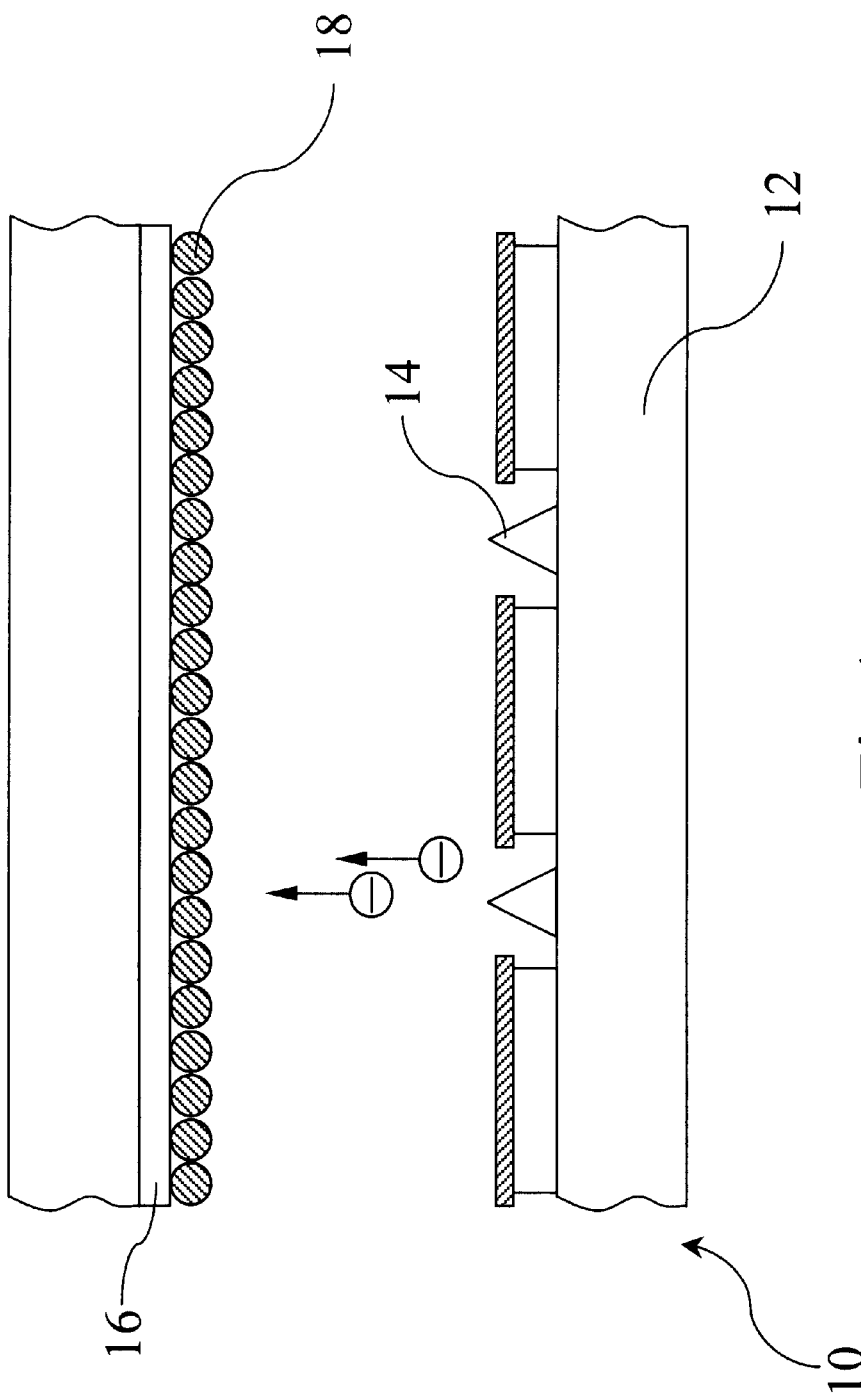
FIG. 1 is a structure diagram of a prior art FED.
Figure 2:
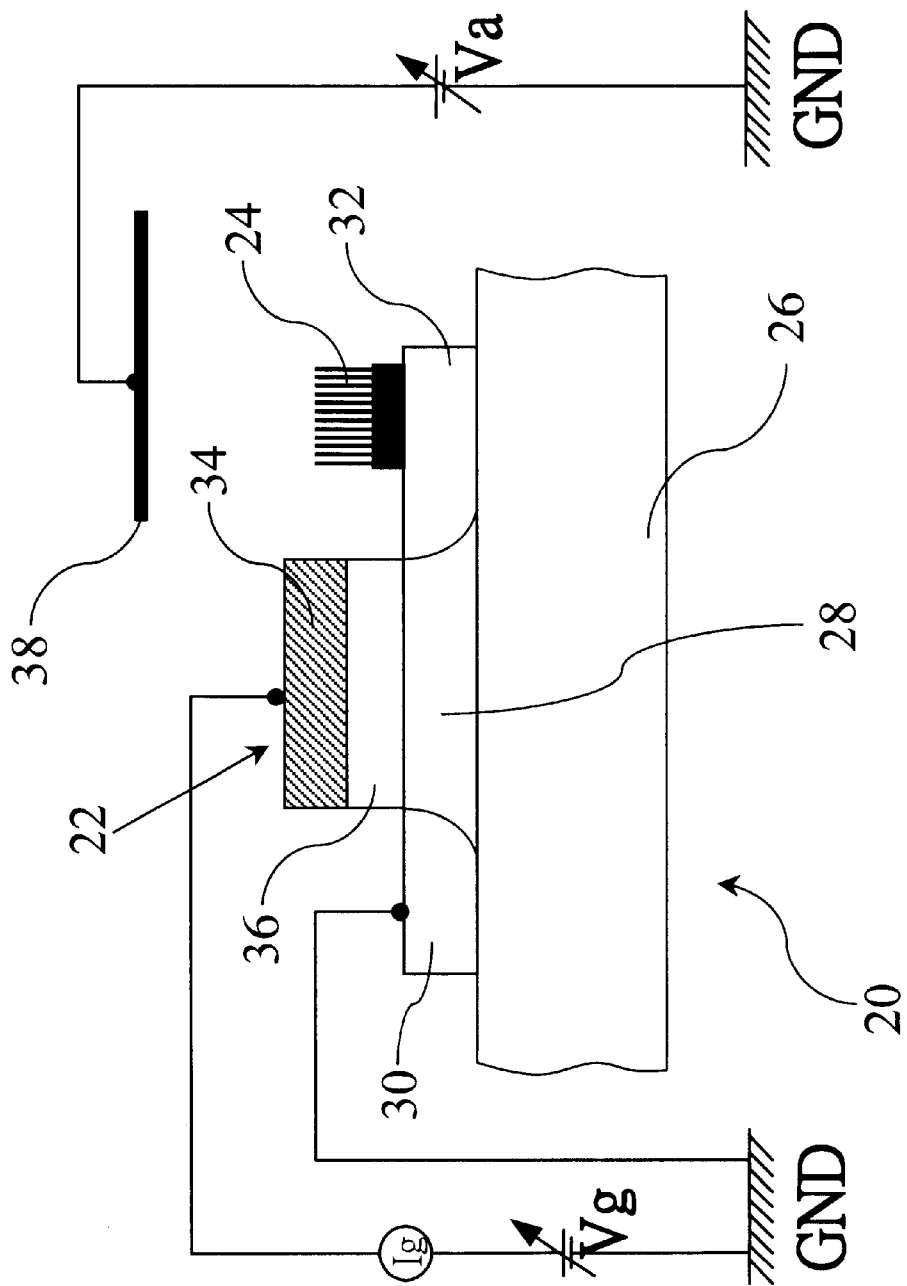
FIG. 2 is a diagram of the field emitting array according to one embodiment of the present invention.

The present invention uses LTPS transistors to directly assemble a field emitting matrix on a glass substrate of a FED, and uses this field emitting matrix to correspond to a transparent electrode so that electrons will be emitted to let a fluorescent layer glow. This field emitting matrix 20 comprises a plurality of arrays of poly-silicon TFTs 22 and a plurality of carbon nanotubes 24 used as field emitting cathodes, as shown in FIG. 2. For each of the poly-silicon TFTs 22, a poly-silicon layer 28 is formed on a glass substrate 26 to be used as the source and drain thereof. A gate 34 is then formed above the poly-silicon layer 28 with an insulating layer 36 separating them. A plurality of carbon nanotubes 24 corresponding to a transparent electrode 38 of ITO are grown on the drain 22 of the TFT 22. The carbon nanotubes 24 will operate at a low voltage to emit electrons so as to let a fluorescent layer 39 glow. This way of using the TFT 22 to control the magnitude and stability of the field emitted current of the carbon nanotubes 24 let the field-emitting characteristic of the carbon nanotubes be stable, thereby simplifying the fabrication process of the field emitting gates and greatly reducing the cost.

The carbon nanotubes are mainly synthesized using the chemical vapor deposition (CVD) technique. Therefore, the present invention will use the CVD system to perform the synthesis of the carbon nanotubes. The carbon nanotubes has an important characteristic of growth, i.e., they can be selectively grown on a metal catalytic layer. The pattern of the required field emitting array can be formed using only the lift-off process of photo resist. The whole process is very simple and applicable to the fabrication of large-scaled devices.

Figure 3:
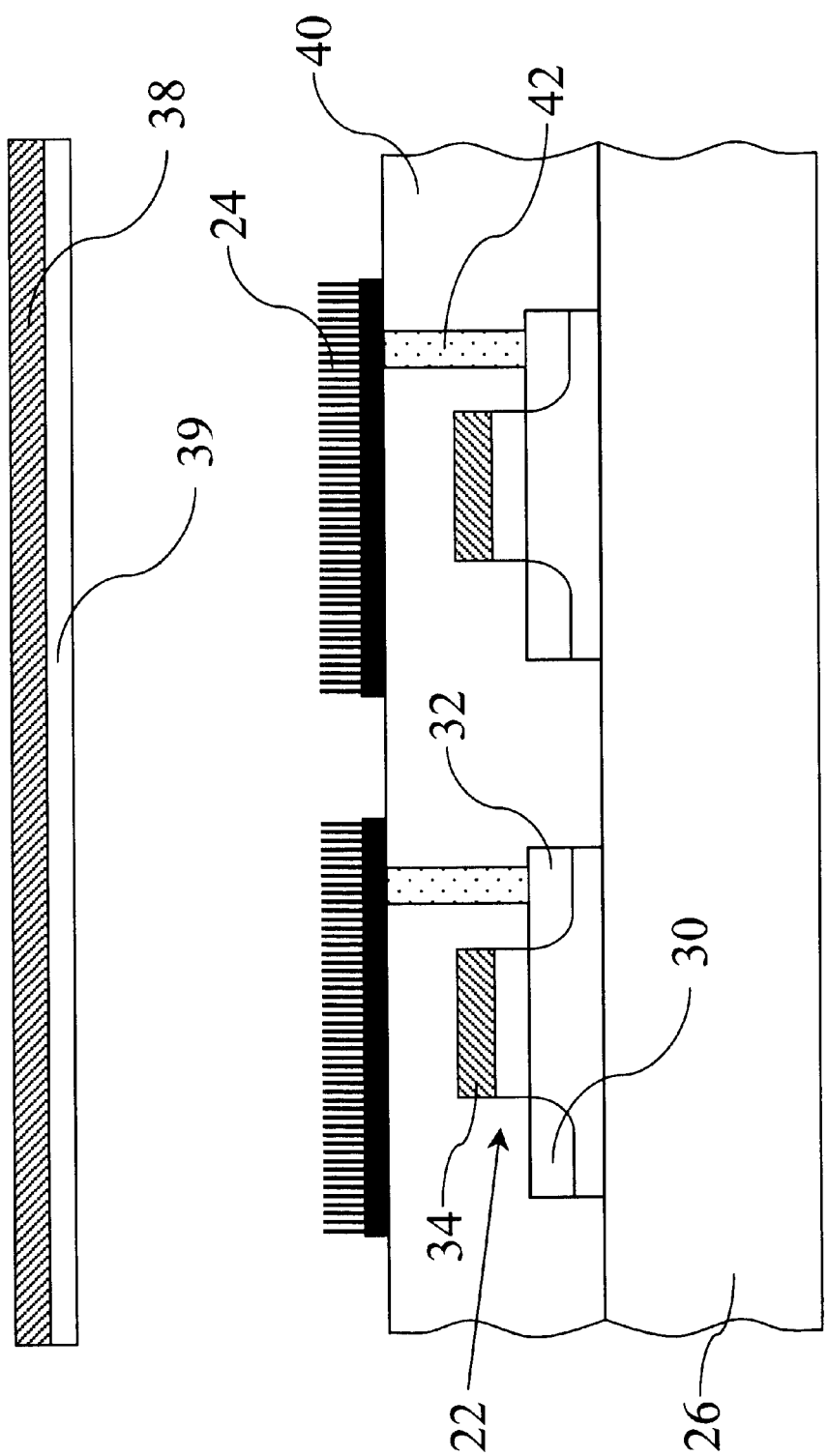
FIG. 3 is a diagram of the field emitting array according to another embodiment of the present invention.

In addition that the carbon nanotubes 24 can be directly fabricated on the drain 32 of the TFT 22 in the present invention, they can be replaced with other structures. As shown in FIG. 3, the field emitting array similarly comprises a plurality of TFTs 22 formed on a glass substrate 26. Each TFT 22 similarly has a source 30, a drain 32, and a gate 34. After a passive layer 40 is coated on the TFT 22, a plurality of carbon nanotubes 24 are grown on the surface of the passive layer 40 above the TFT 22. The surface of the passive layer 40 faces the transparent electrode and the fluorescent layer 38. Each group of carbon nanotubes 24 is electrically connected to the corresponding drain 32 through a via 42. The TFT 22 is exploited to control the field-emitted current of the carbon nanotubes 24 to emit electrons. This kind of structure has the advantage that modularized TFTs can be directly used in FEDs of carbon nanotubes so that the production will be more convenient and simpler.

The present invention mainly uses a low-temperature process to fabricate poly-silicon TFTs on a glass substrate so as to form a field emitting array. This way of using the LTPS technique to fabricate TFTs has the following advantages.

(1). Because poly-silicon is obtained using a low-temperature process, TFTs can be directly fabricated on a common glass substrate, thereby obtaining a large area and greatly reducing the cost.

(2). The complex driving circuit can be directly fabricated on the glass substrate so that the volume and weight of the display can be much reduced, thereby greatly reducing the cost.

(3). TFTs fabricated using the LTPS technique can drive larger currents and have smaller leakage currents. These are very important for flat displays requiring larger currents, such as the FEDs of the present invention.

(4). The electronic device fabricated using the LTPS technique has very high carrier mobility, very high switching rate, and very good device reliability.

Therefore, FEDs of high quality, large area, and low cost can be manufactured using the LTPS technique so that the LTPS technique will become the trend of future flat displays.

The above embodiments of the present invention uses LTPS TFTs to illustrate field emitting arrays. However, the material of the TFT is not limited to poly-silicon in the present invention. Other TFTs of amorphous silicon material can also be used in the present invention.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. A field emitting display formed by directly assembling a field emitting array on a transparent substrate, said field emitting array corresponding to a transparent electrode for emitting electrons to let a fluorescent layer glow, said field emitting array comprising:

a plurality of arrays of thin film transistors formed on said transparent substrate, each said thin film transistor having a source, a drain, and a gate; and a plurality of carbon nanotubes installed on said drain of each said thin film transistor and corresponding to said transparent electrode, the field-emitted current of said carbon nanotubes being controlled by said thin film transistors to emit electrons.

2. The field emitting display as claimed in claim 1, wherein said transparent substrate is a glass substrate.

3. The field emitting display as claimed in claim 1, wherein said thin film transistors can be poly-silicon thin film transistors or amorphous silicon thin film transistors.

4. The field emitting display as claimed in claim 3, wherein said poly-silicon thin film transistors are fabricated by a low-temperature fabrication technique.

5. A field emitting display formed by directly assembling a field emitting array on a transparent substrate, said field emitting array corresponding to a transparent electrode for emitting electrons to let a fluorescent layer glow, said field emitting array comprising:

a plurality of arrays of thin film transistors formed on said transparent substrate, each said thin film transistor having a source, a drain, and a gate;

a passive layer coated on said thin film transistors to cover them; and a plurality of groups of carbon nanotubes installed on the surface of said passive layer over each said thin film transistor and corresponding to said transparent electrode, each group of said carbon nanotubes being electrically connected to said drain through a via, the field-emitted current of said carbon nanotubes being controlled by said thin film transistor to emit electrons.

6. The field emitting display as claimed in claim 5, wherein said transparent substrate is a glass substrate.

7. The field emitting display as claimed in claim 5, wherein said thin film transistors can be poly-silicon thin film transistors or amorphous silicon thin film transistors.

8. The field emitting display as claimed in claim 7, wherein said poly-silicon thin film transistors are fabricated by a low-temperature fabrication technique.

* * * * *